United States Patent
Tsukagoshi et al.

(10) Patent No.: US 7,715,072 B2
(45) Date of Patent: May 11, 2010

(54) HOLOGRAM RETRIEVAL METHOD AND HOLOGRAPHIC RECORDING AND REPRODUCING APPARATUS

(75) Inventors: Takuya Tsukagoshi, Sagamihara (JP); Jiro Yoshinari, Tokyo (JP); Hideaki Miura, Tokyo (JP); Tetsuro Mizushima, Tokyo (JP)

(73) Assignee: TDK Corporation, Tokyo (JP)

( * ) Notice: Subject to any disclaimer, the term of this patent is extended or adjusted under 35 U.S.C. 154(b) by 141 days.

(21) Appl. No.: 10/589,362

(22) PCT Filed: Jan. 6, 2005

(86) PCT No.: PCT/JP2005/000084

§ 371 (c)(1),
(2), (4) Date: Aug. 14, 2006

(87) PCT Pub. No.: WO2005/083689

PCT Pub. Date: Sep. 9, 2005

(65) Prior Publication Data

US 2007/0180183 A1    Aug. 2, 2007

(30) Foreign Application Priority Data

Mar. 1, 2004    (JP) .............................. 2004-056361

(51) Int. Cl.
*G02B 5/32*    (2006.01)
*G03H 1/04*    (2006.01)

(52) U.S. Cl. ............................. 359/22; 359/21; 359/11; 359/35; 369/103; 365/125

(58) Field of Classification Search .................. 359/22, 359/21; 369/103; 365/125
See application file for complete search history.

(56) References Cited

U.S. PATENT DOCUMENTS 5,319,629 A * 6/1994 Henshaw et al. ............ 369/103
7,274,497 B2 * 9/2007 Tsukagoshi et al. ........... 359/22

FOREIGN PATENT DOCUMENTS

JP    A 9-197947    7/1997

(Continued)

OTHER PUBLICATIONS

Geoffrey W. Burr et al., "Content-addressable data storage by use of volume holograms," Applied Optics, vol. 32, pp. 6779-6784, Nov. 10, 1999.

*Primary Examiner*—Audrey Y Chang
(74) *Attorney, Agent, or Firm*—Oliff & Berridge, PLC

(57) ABSTRACT

Provided is a hologram retrieval method and a holographic recording and reproducing apparatus for preventing an increase in SNR, a decrease in retrieval accuracy, or the retrieval itself from being made impossible, which would otherwise occur because of a small size of data used for retrieval. Digital information is recorded on a holographic recording medium as data pages DP formed of a two-dimensional bit map image with each page being multiplexed. The data page DP is divided into a plurality of equal data blocks DB11 to 13, DB21 to DB23, and DB31 to DB33, and each data block DB is provided with a data image that is encoded by an encoding method for providing a certain number of ON pixels within each data block DB. A spatial light modulator allows the to-be-retrieved data image to be encoded by the encoding method and displayed as block information on a retrieval data block associated with the data block, and a signal beam to be thereby modulated. Of resulting diffracted beams, the diffracted beam of the maximum intensity is used to detect the target data image and the address of the reference beam.

20 Claims, 11 Drawing Sheets

FOREIGN PATENT DOCUMENTS

| | | |
|---|---|---|
| JP | A-11-136525 | 5/1999 |
| JP | A 2000-123133 | 4/2000 |
| JP | A 2000-268381 | 9/2000 |
| JP | A-2000-278699 | 10/2000 |
| JP | A2001-93157 | 4/2001 |
| JP | A-2001-118254 | 4/2001 |
| JP | A-2003-521794 | 7/2003 |
| JP | A 2005-31395 | 2/2005 |
| WO | WO 01/57859 A2 | 8/2001 |

* cited by examiner (A)

(B)

(B)

(A)

(A)

(B)

(C)

(D)

(E)

(F)

(G)

(H)

(I)

HOLOGRAM RETRIEVAL METHOD AND HOLOGRAPHIC RECORDING AND REPRODUCING APPARATUS

TECHNICAL FIELD

The present invention relates to a holographic recording and reproducing apparatus for irradiating an object beam and a reference beam onto a holographic recording medium in order to record information thereon using interference fringes as well as to reproduce the recorded information, and also relates to a method for retrieving a hologram to reproduce information.

BACKGROUND ART

There is a holographic recording and reproducing method and apparatus available as one of high-speed mass storage technologies that allow for storing massive amounts of digital information.

This holographic recording and reproducing method and apparatus stores digital information as data pages formed of a two-dimensional bit map image with each page being multiplexed.

Such a holographic recording and reproducing method and apparatus provides not only a high-speed massive storage capability but also a retrieval and reproduction capability referred to as the "associative reproduction" or a very-high-speed retrieval capability of instantaneously finding out specific data using the volumetric nature of holograms.

An example of this is described in APPLIED OPTICS, Vol. 38, No. 32, p 6779 to 6784, 10 Nov. 1999. In this example, a holographic recording medium having data pages recorded thereon with each page being multiplexed is irradiated with a signal beam that has been modulated by a spatial light modulator using a data image being retrieved, thereby allowing diffracted beams to be transmitted. Of the resulting diffracted beams, the diffracted beam of the maximum intensity is used to detect the data page of the data image provided to the signal beam and the address of a reference beam associated therewith.

Here, the hologram retrieval method according to the aforementioned holographic recording and reproducing method and apparatus allows for detecting a diffracted beam on one data page basis. Thus, the method has a problem that retrieval of small size data causes the amount of diffracted light to be decreased, resulting in the accuracy of retrieval (SNR) being degraded.

In contrast to this, an increase in the exposure time of a signal beam for retrieval causes an increase in noise light, and thus the SNR cannot be prevented from being reduced.

There is also another problem that the retrieval accuracy is reduced or the retrieval itself is made impossible as the size of data used for retrieval is reduced.

This is caused by increases in crosstalk between pages at the time of retrieval depending on the similarity of data images associated with respective data pages (or depending on the number of common ON pixels).

That is, a decrease in size of an image zone used for retrieval makes it difficult to ignore the similarity in the other zones (or accidental matching). Thus, this raises a problem of increasing the probability of "retrieval error," in the case of which with no correlation being found in searched pixel zones, a strongly correlated data page is extracted in other zones as a result of a search.

DISCLOSURE OF THE INVENTION

The present invention has been devised in view of the aforementioned problems. It is therefore an object of the present invention to provide a hologram retrieval method which prevents even small size data used for retrieval from causing a decrease in retrieval accuracy or the retrieval itself to be made impossible, and a holographic recording and reproducing apparatus for carrying out the hologram retrieval method.

Note that as used herein, the terms "ON pixels" and "OFF pixels" refer in a spatial light modulator to those pixels which allow light to pass therethrough and which do not allow light to pass therethrough, respectively, and refer on a recorded data page to those pixels associated with the "ON pixels" and "OFF pixels" which are displayed on the spatial light modulator, respectively.

As a result of intensive studies, the inventor has found that, to record a data page on a holographic recording medium, the data is recorded as block information on each of the data blocks that are obtained by dividing the data page into a plurality of equal parts, and at the time of retrieval, the retrieval data is displayed on a spatial light modulator on the data block basis, and a signal beam is modulated to irradiate the holographic recording medium and from a resulting diffracted beam, the data page containing the block information can be retrieved, thereby achieving the aforementioned objects.

In summary, the above-described objectives are achieved by the following embodiments of the present invention.

(1) A hologram retrieval method comprising the steps of: irradiating a signal beam that has been modulated by a spatial light modulator using a data image to be retrieved onto holographic recording medium having digital information recorded thereon as data pages formed of a two-dimensional bit map image with each page being multiplexed to transmit a diffracted beam; and detecting a data image address provided to the signal beam using a resulting diffracted beam, wherein: the data page is formed of a plurality of equally divided data blocks and a data image is formed within each data block by an encoding method for providing a certain number of ON pixels; and the spatial light modulator encodes the data image to be retrieved by the encoding method to display it as block information on at least one retrieval data block associated with the data block and modulates a signal beam using the block information, and of resulting diffracted beams, a diffracted beam of the maximum intensity is used to identify an address of a data block and a data page containing a target data image.

(2) The hologram retrieval method according to (1), wherein all pixels in a retrieval data block other than a retrieval data block on which the block information is displayed are OFF pixels.

(3) The hologram retrieval method according to (1) or (2), wherein part of data blocks in the data page is employed as a dedicated retrieved data block, and an encoding method is used to provide a larger number of ON pixels for a data image formed in the dedicated retrieved data block than for a data image of another data block.

(4) The hologram retrieval method according to any one of (1) to (3), wherein a beam diameter and an optical path of the signal beam are adjusted such that the signal beam passes substantially only through a retrieval data block displayed on the spatial light modulator.

(5) The hologram retrieval method according to any one of (1) to (4), wherein the block information is sequentially displayed on the plurality of retrieval data blocks in the spatial light modulator.

(6) The hologram retrieval method according to (1), wherein the block information is displayed at the same time on all retrieval data blocks in the spatial light modulator, and of a plurality of resulting diffracted beams, a diffracted beam of the maximum intensity is used to identify a data page containing the block information.

(7) A hologram retrieval method comprising the steps of: irradiating a signal beam that has been modulated by a spatial light modulator using a data image to be retrieved onto a holographic recording medium having digital information recorded thereon as data pages formed of a two-dimensional bit map image with each page being multiplexed to transmit a diffracted beam; and detecting a data image address provided to the signal beam using a resulting diffracted beam, wherein: the data page is formed of a plurality of equally divided data blocks and a data image is formed in each data block by an encoding method for providing a different number of ON pixels for each data block; and the spatial light modulator encodes the same data image to be retrieved by the encoding method to display it as block information on all retrieval data blocks associated with the data block and modulates a signal beam using the block information, and an amount of light of a resulting diffracted beam is used to identify an address of a data block and a data page containing a data image to be retrieved.

(8) The hologram retrieval method according to any one of (1) to (7), wherein a reproduction reference beam associated with the identified data page is used for irradiation to reproduce retrieval information.

(9) A holographic recording and reproducing apparatus comprising: an object optical system and a reference optical system for directing an object beam and a reference beam to a holographic recording medium; a spatial light modulator provided in the object optical system to allow to-be-recorded digital information to be displayed as a data page formed of a two-dimensional bit map image, thereby being capable of modulating an object beam; a retrieval imaging device for receiving a plurality of diffracted beams produced when the holographic recording medium having a hologram recorded thereon is irradiated with a signal beam from the object optical system; a signal processing circuit for processing an output signal from the retrieval imaging device, and a reproduction imaging device for receiving a diffracted beam produced at the time of irradiation with a reproduction reference beam from the reference optical system, wherein: the spatial light modulator is capable of displaying the digital information as an encoded data image on each of data blocks obtained by dividing the data page into a plurality of equal parts, and is capable of allowing a to-be-retrieved data image to be encoded by the same encoding method as for the data image and displayed as block information; and the signal processing circuit identifies an address of a data page containing the data image based on a diffracted beam of the maximum intensity of the plurality of diffracted beams.

(10) The holographic recording and reproducing apparatus according to (9), wherein the spatial light modulator is configured such that all pixels in a retrieval data block other than a retrieval data block on which the block information is displayed are OFF pixels.

(11) The holographic recording and reproducing apparatus according to (9) or (10), wherein the spatial light modulator is designed such that part of data blocks in the data page is employed as a dedicated retrieved data block, and an encoding method is used to provide a larger number of ON pixels for a data image formed in the dedicated retrieved data block than for a data image of another data block.

(12) The holographic recording and reproducing apparatus according to any one of (9) to (12), wherein the object optical system is configured such that a beam diameter and an optical path of the signal beam can be adjusted so that the signal beam passes substantially only through a retrieval data block displayed on the spatial modulator.

(13) The holographic recording and reproducing apparatus according to any one of (9) to (12), wherein the spatial light modulator is configured such that the block information can be sequentially displayed on the plurality of retrieval data blocks.

(14) The holographic recording and reproducing apparatus according to (9), wherein: the spatial light modulator is configured such that the block information can be displayed at the same time on all retrieval data blocks in the spatial light modulator; and the signal processing circuit is configured such that of a plurality of diffracted beams obtained from the retrieval imaging device, a diffracted beam of the maximum intensity is used to identify a data page containing the block information.

(15) A holographic recording and reproducing apparatus comprising: an object optical system and a reference optical system for directing an object beam and a reference beam to a holographic recording medium; a spatial light modulator provided in the object optical system to allow to-be-recorded digital information to be displayed as a data page formed of a two-dimensional bit map image, thereby being capable of modulating an object beam; a retrieval imaging device for receiving a plurality of diffracted beams produced when the holographic recording medium having a hologram recorded thereon is irradiated with a signal beam from the object optical system; a signal processing circuit for processing an output signal from the retrieval imaging device; and a reproduction imaging device for receiving a diffracted beam produced at the time of irradiation with a reproduction reference beam from the reference optical system, wherein the spatial light modulator is capable of displaying the digital information as a data image, the data image being encoded by an encoding method for providing a different number of ON pixels for each data block, on each of data blocks obtained by dividing the data page into a plurality of equal parts, and is capable of allowing the to-be-retrieved data image to be encoded by the same encoding method as for the data image and displayed as block information, and the signal processing circuit identifies an address of a data block and a data page containing a data image being retrieved based on an amount of diffracted light obtained from the retrieval imaging device.

BEST MODE FOR CARRYING OUT THE INVENTION

Figure 1:
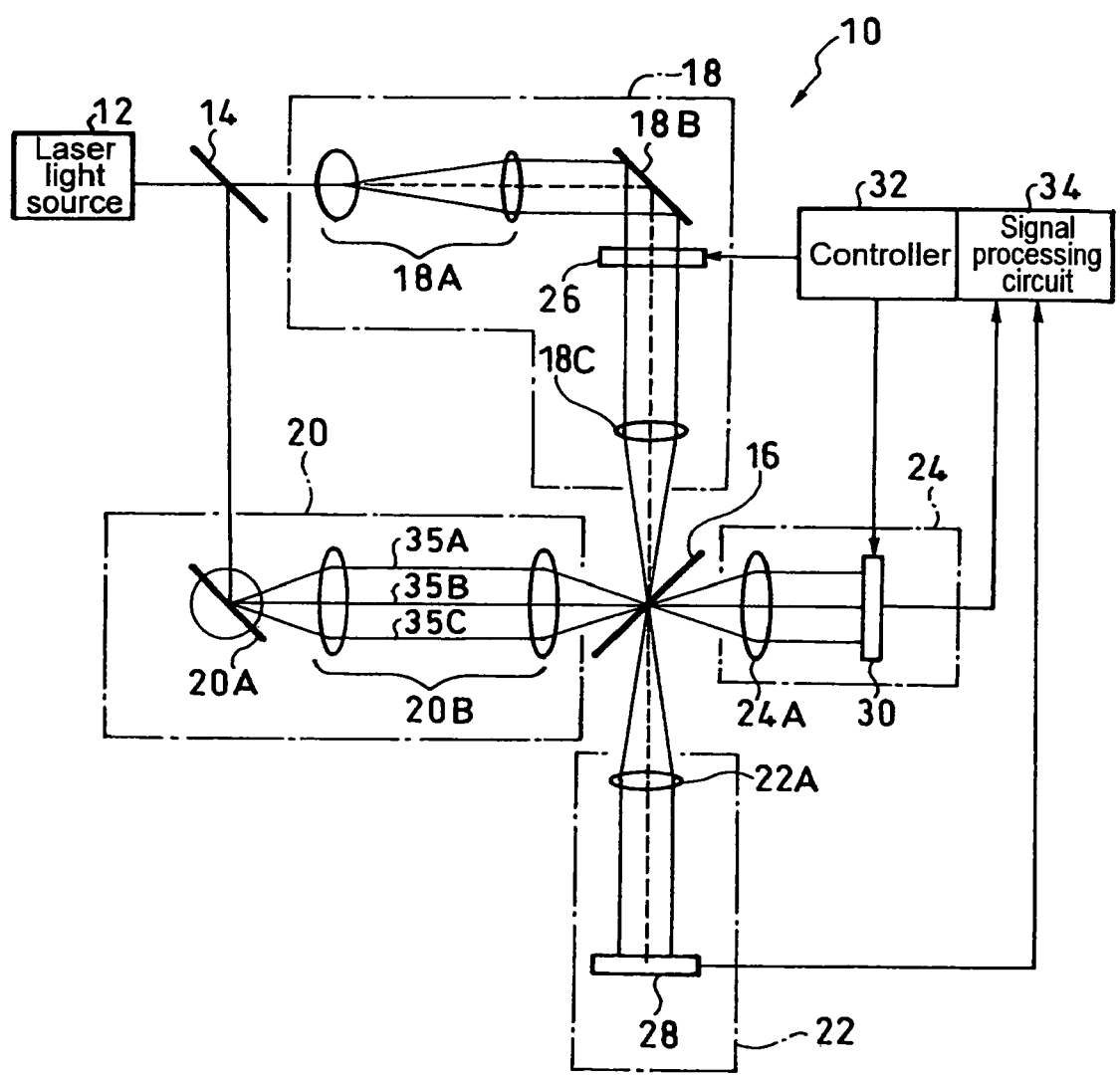
FIG. 1 is an optical system diagram illustrating a holographic recording and reproducing apparatus according to a first embodiment of the present invention.

Digital information is recorded on a holographic recording medium as data pages formed of a two-dimensional bit map image with each page being multiplexed. The data page is divided into a plurality of equal data blocks, and a data block is provided with a data image that has been encoded by an encoding method for providing a certain number of ON pixels within each data block. A spatial light modulator allows a data image being retrieved to be encoded by the encoding method and displayed as block information on a retrieval data block associated with the data block, and a signal beam to be thereby modulated. Of the resulting diffracted beams, the diffracted beam of the maximum intensity is used to detect the target data image and the address of the reference beam.

First Embodiment

Now, referring to FIGS. 1 to 3, a holographic recording and reproducing apparatus 10 according to a first embodiment of the present invention will be described.

The holographic recording and reproducing apparatus 10 is configured to include: a laser light source 12; a beam splitter 14 for splitting a laser beam from the laser light source 12 into a transmitted beam serving as an object beam and a reflected beam serving as a reference beam; an object optical system 18 for directing the object beam to a holographic recording medium (hereinafter referred to as the recording medium) 16; a reference optical system 20 for directing the reference beam to the recording medium 16; an imaging optical system 22 for receiving a diffracted beam produced when the recording medium 16 is irradiated with a reproduction reference beam from the reference optical system 20 for reproducing information; and a retrieval optical system 24 for receiving, at the time of retrieval, a diffracted beam produced when the recording medium 16 is irradiated with a signal beam from the object optical system 18.

The object optical system 18 is configured to include, in the order from the beam splitter 14 side, a beam expander 18A for expanding the beam diameter of an object beam having passed through the beam splitter 14; a mirror 18B for reflecting at a right angle the object beam of a beam diameter having been expanded by the beam expander 18A; a spatial light modulator 26 for displaying a two-dimensional bit map image having been encoded according to digital information to be recorded, or at the time of retrieval, for encoding and displaying a data image to be retrieved to modulate an object beam reflected off a mirror 18B or a signal beam; and a Fourier lens 18C for Fourier transforming an object beam provided with a bit map image by the spatial light modulator 26 and for allowing the object beam to be focused and incident on the holographic recording medium 16.

The reference optical system 20 is configured to include, in the order from the beam splitter 14 side, a rotation mirror 20A which is rotatable to reflect a reference beam reflected off the beam splitter 14 towards the recording medium 16 as well as to deflect its angle of reflection in a plurality of steps so that the reference beam travels selectively along one of a plurality of different optical paths 35A, 35B, 35C . . . ; and a group of lenses 20B which allow any reference beam reflected off the rotation mirror 20A and traveling along a different optical path to be refracted so that the reference beam is incident upon an intersection with the object beam in the vicinity of the recording medium 16.

The imaging optical system 22 is configured to include: a reproduction imaging device 28 which is disposed on an extended optical path of a diffracted beam produced when a reproduction reference beam is directed along the optical path of the reference beam; and a focusing lens 22A disposed between the reproduction imaging device 28 and the recording medium 16.

On the other hand, the retrieval optical system 24 is configured to include: a retrieval imaging device 30 which is disposed on the optical path of a diffracted beam, produced when the recording medium 16 is irradiated with a signal beam from the object optical system 18, to receive the diffracted beam; and a focusing lens 24A which is disposed on the optical path of the diffracted beam between the retrieval imaging device 30 and the recording medium 16. Retrieval imaging device 30 is also herein referred to as search imaging device 30.

In FIG. 1, the reference numerals 32 and 34 indicate a controller and a signal processing circuit, respectively. The controller 32 is configured to allow the spatial light modulator 26 to display digital information to be recorded as a data page formed of a two-dimensional bit map image.

Figure 2:
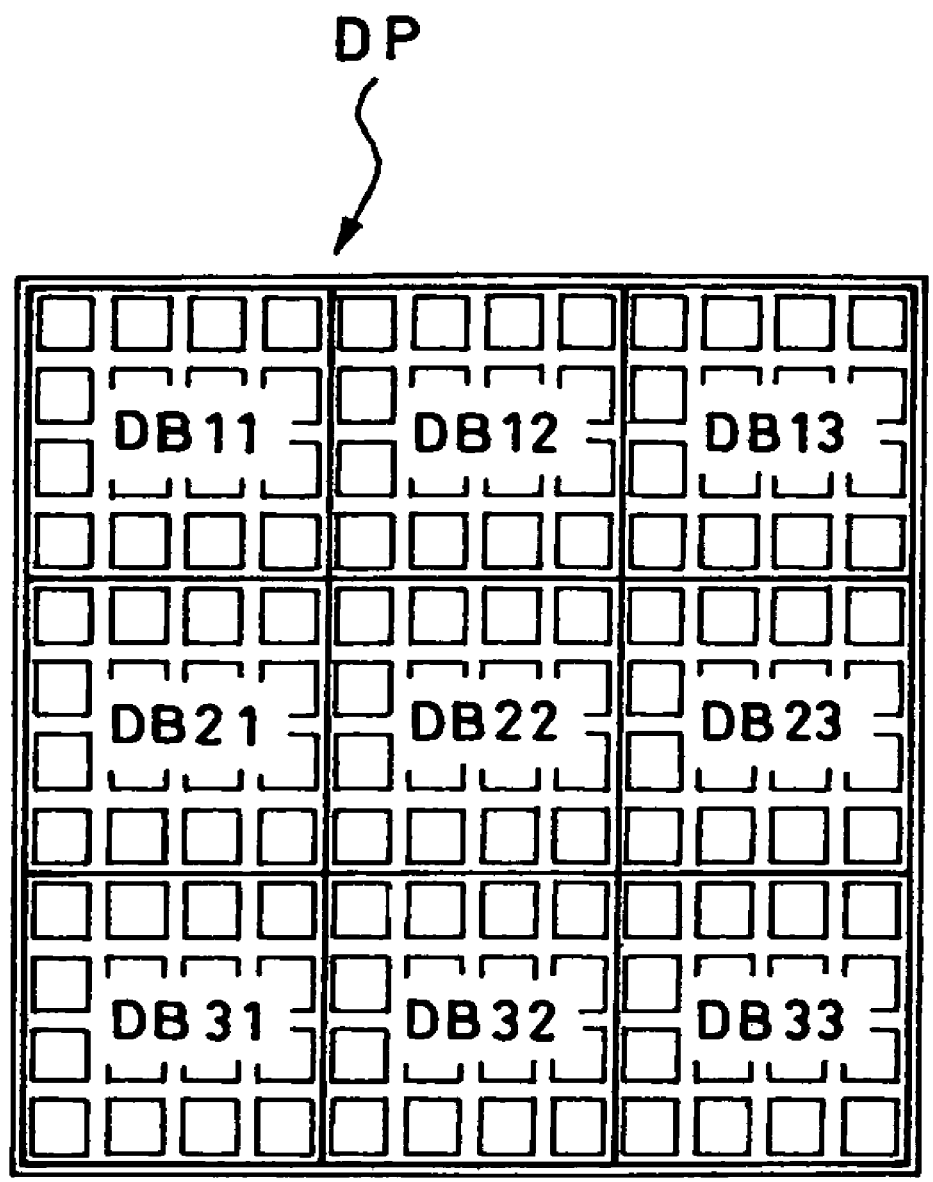
FIG. 2 is a schematic plan view illustrating the relation between a data page, which is displayed on a spatial light modulator or recorded on a holographic recording medium, and data blocks constituting the data page in accordance with the first embodiment.
Figure 3:
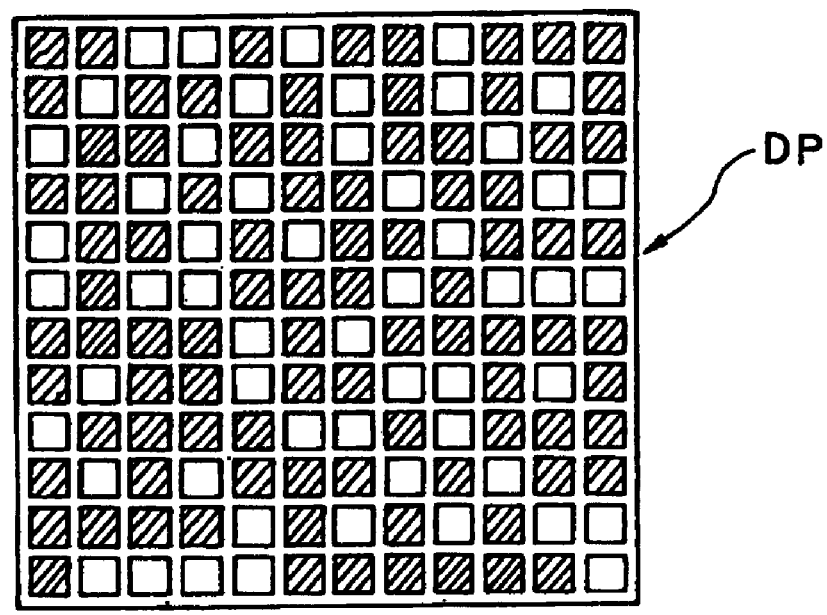
FIG. 3 is a schematic plan view illustrating a recorded data page and a retrieval data block at the time of retrieval in the first embodiment.
Figure 3:
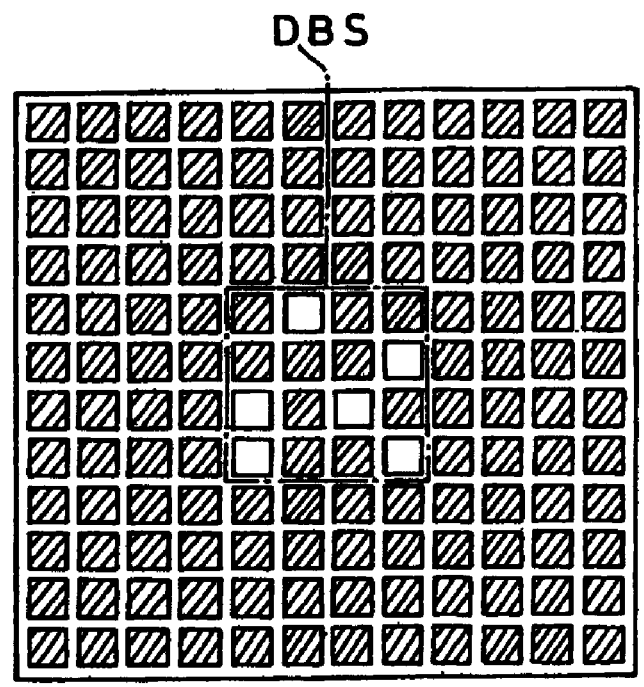

More specifically, for example, as shown in FIG. 2, the controller 32 allows the spatial light modulator 26 to display the digital information to be recorded, as an encoded data image, on each of data blocks DB11 to DB33 (collectively referred to as the data block DB) which are obtained by dividing a data page DP into a plurality of equal parts.

The spatial light modulator 26 is also allowed to encode a data image to be retrieved, by the same encoding method as for recording the data image and display the resulting data image on part or front part of the data blocks DB11 to DB33 as block information. Here, the data block on which the data image to be retrieved is displayed as block information is referred to as the retrieval data block DBS (see FIG. 3(B)). A data page that includes an encoded data image, such as the data page containing data blocks DB11 to DB33, used to retrieve a data image, is herein referred to as a search data page and an encoded data image in a data block of a search data page is herein referred to as an encoded search image or encoded search information.

Note that, in the first embodiment, the data blocks DB11 to DB33 are designed such that each includes a total of 16 pixels in a four by four matrix, and at the time of recording, any of the data blocks DB11 to DB33 has six ON pixels just like the data page DP shown in FIG. 3(A).

For example, as shown in FIG. 3(B), the first embodiment is also configured such that the controller 32 allows the spatial light modulator 26 to cause all the pixels in a data block DB, other than those in the retrieval data block DBS on which the block information is displayed, to be turned into OFF pixels.

The signal processing circuit 34 is configured to detect the intensity, i.e., the amount of light of a diffracted beam from each of the data blocks DB11 to DB33, the diffracted beam being received by the retrieval imaging device 30 when the data page DP recorded on the recording medium 16 is irradiated with a signal beam, and thus detect the amount of light from each of the data blocks DB11 to DB33 and/or the data block providing the maximum amount of light. Based on this, the signal processing circuit 34 is also adapted to identify the data block DB and the data page DP containing the retrieval information as well as to identify the address of the reference beam used for the storage of the data page DP.

Note that the data page DP is angularly multiplexed for recording on the recording medium 16 by the rotation mirror 20A being rotated in a stepwise manner.

Now, a description will be given to a case where the holographic recording and reproducing apparatus 10 according to the first embodiment retrieves, e.g., the data block DB22 (the central data block) in the data page DP as shown in FIG. 3(A) and the data page DP containing the data block DB22.

To begin with, the controller 32 allows the to-be-retrieved block information to be displayed at the position of the data block DB22 at the center of the spatial light modulator 26. With this employed as the retrieval data block DBS and all the pixels of the other data block DB turned OFF, the controller 32 provides the state as shown in FIG. 3(B).

Under this condition, a signal beam emitted from the laser light source 12 and incident upon the object optical system 18 is modulated in the spatial light modulator 26, and passes through the Fourier lens 18C, so that the recording medium 16 is irradiated with the signal beam.

At this time, a diffracted beam corresponding to the reference beam used for recording is transmitted from the recording medium 16. As described above, if the data page DP has been angularly multiplexed for recording on the recording medium 16 by the rotation mirror 20A being rotated in a stepwise manner, then a plurality of diffracted beams are produced from the recording medium 16 and incident upon the retrieval imaging device 30 via the focusing lens 24A.

The signal processing circuit 34 detects the diffracted beam of the maximum intensity among the plurality of incident diffracted beams, thereby allowing for identifying the data page DP containing the block information shown in FIG. 3(B) and for determining the address of the reference beam used for recording. On the other hand, suppose that when a diffracted beam incident upon the retrieval imaging device 30 has the maximum amount of light, a reproduction reference beam is incident from the reference optical system 20 upon the recording medium 16 at the same angle of incidence as that of the detected reference beam. In this case, a diffracted beam corresponding to the data page DP containing the information of the data block DB22 is transmitted from the recording medium 16 and then received by the reproduction imaging device 28, thereby making it possible to obtain the information of the intended data page DP from the signal processing circuit 34.

In the first embodiment, all the pixels are turned OFF in a data block DB other than the retrieval data block DBS on which the data to be retrieved is displayed. Thus, it is possible to block a signal beam associated with the data block DB that is not utilized for retrieval, thereby reducing noise components to provide retrieval with improved accuracy.

Note that the first embodiment employs only one data block for retrieval; however, the present invention is not limited thereto but also makes it possible to display block information at the same time on a plurality of data blocks to make an "AND search" or "OR search."

Second Embodiment

Now, referring to FIG. 4(A) and FIG. 4(B), a second embodiment of the present invention will be described.

A data page DP2 according to the second embodiment is designed to employ, at the time of its recording, one or more of the data blocks DB11 to DB33 as a search dedicated data block DB0 which is obtained by imaging block information that is (possibly) used for retrieval. On the search dedicated data block DB0, information is recorded which is imaged by an encoding method of providing a larger number of ON pixels when compared with block information in the other data blocks.

Figure 4:
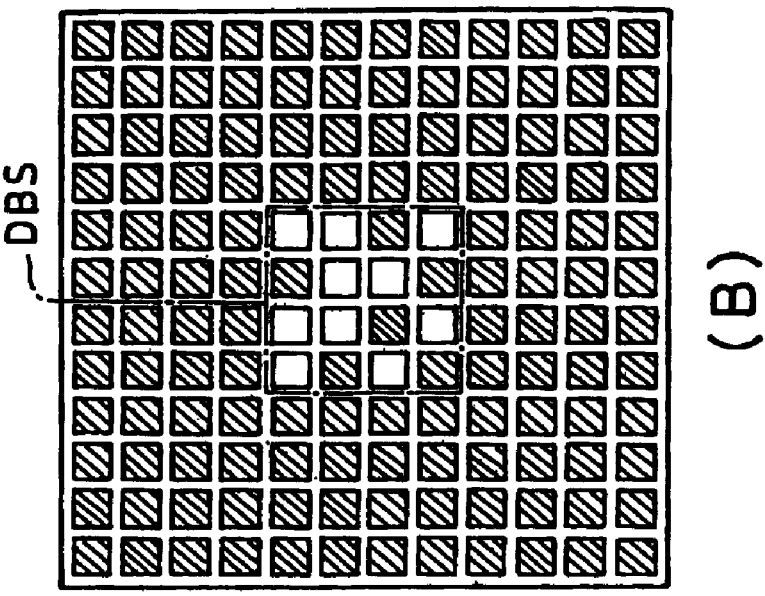
FIG. 4 is a schematic plan view illustrating a recorded data page and a retrieval data block for retrieving the data page in a second embodiment.
Figure 4:
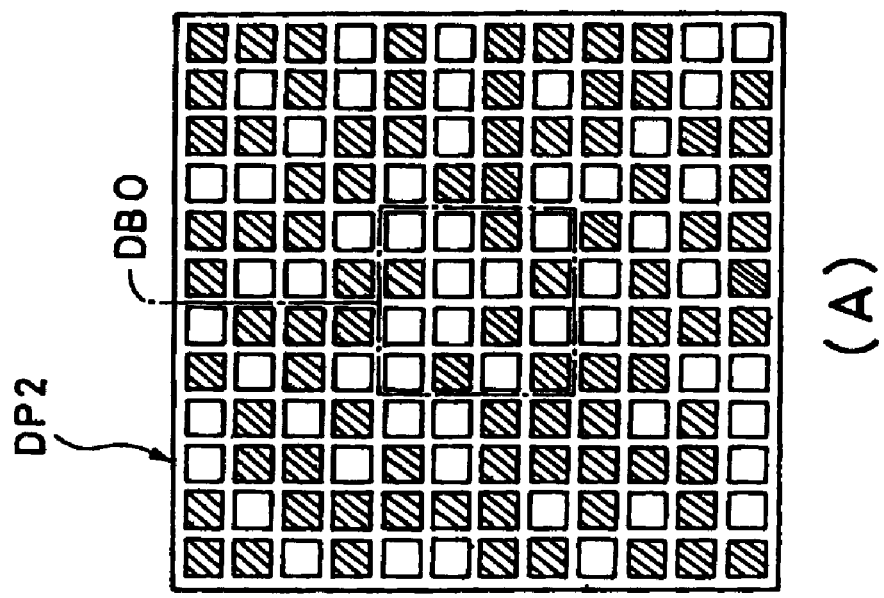

As shown in FIG. 4(A), the search dedicated data block DB0 is provided with ten ON pixels in the second embodiment, whereas the other data blocks DB are provided with six ON pixels.

In general, since the intensity of a retrieval sense signal is proportional to the number of ON pixels contained in a retrieval image, this embodiment makes it possible to provide a higher sense signal intensity when compared with a case where all the surrounding data blocks have OFF pixels.

As described above, such an increase in the intensity of a retrieval signal, i.e., in SNR would make it possible to increase the intensity of the sense signal not only when all the data blocks not used for retrieval are OFF pixels but also when the entire data page is searched.

As shown in FIGS. 4(A) and (B), the search dedicated data block DB0 is provided with ten ON pixels. This allows for providing a 10/6 or nearly equal to 1.67 times higher retrieval accuracy or amount of diffracted light on average when compared with the case shown in FIGS. 3(A) and (B) (with six ON pixels).

Third Embodiment

Figure 5:
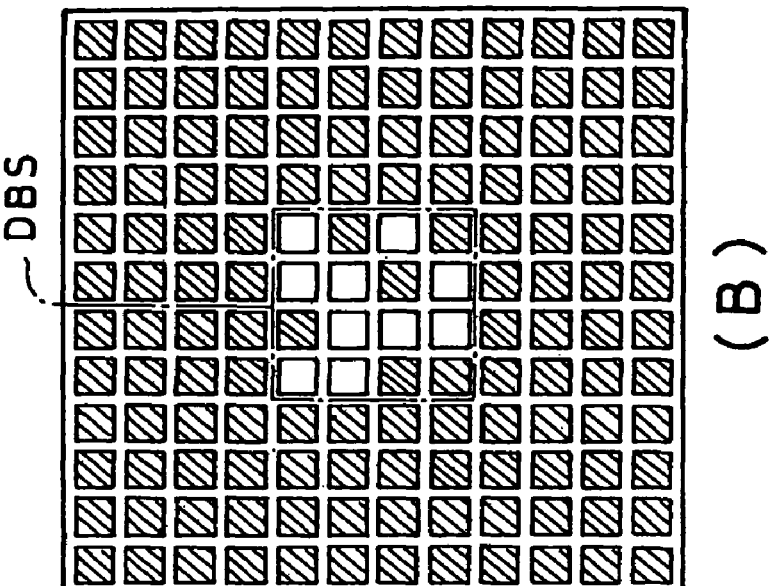
FIG. 5 is a schematic plan view illustrating a recorded data page and a retrieval data block for retrieving the data page in a third embodiment.
Figure 5:
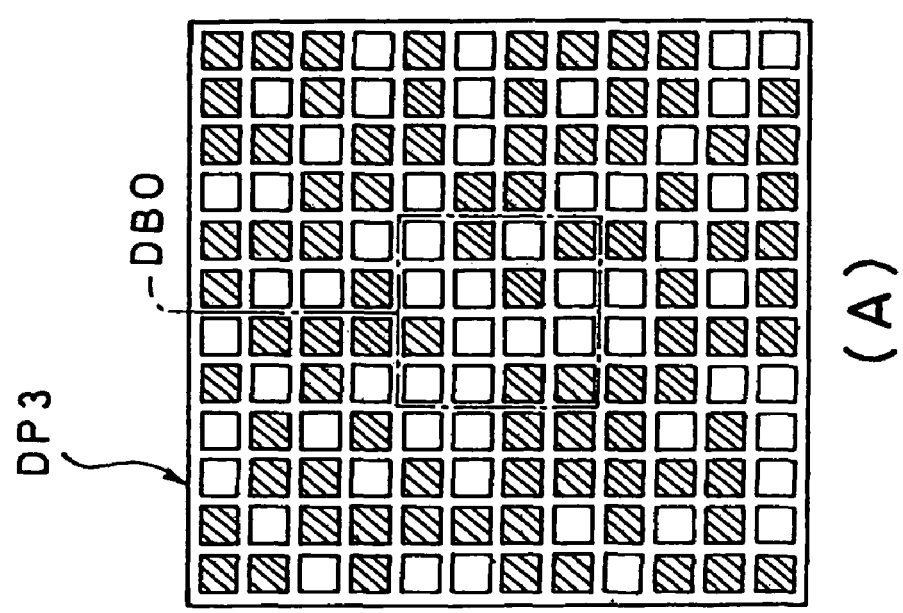

Now, a third embodiment of the present invention shown in FIG. 5 will be described.

A data page DP3 of the third embodiment is different from the data page DP2 of FIG. 4(A) in that the search dedicated data block DB0 is encoded to reverse the ON pixels and the OFF pixels in the retrieval data block DBS of FIG. 3(B).

The third embodiment provides the same retrieval signal intensity and retrieval accuracy as those of the second embodiment of FIGS. 4(A) and (B) above. However, when compared with the second embodiment, this embodiment has an advantage of providing a less amount of signal processing computation required for encoding the search dedicated data block DB0.

Fourth Embodiment

Now, a fourth embodiment of the present invention shown in FIG. 6 will be described.

A holographic recording and reproducing apparatus 40 according to the fourth embodiment has the same configuration as that of the holographic recording and reproducing apparatus 10 according to the first embodiment shown in FIG.

1, except that the beam expander 18A is replaced by a beam expander 42 which is differently configured.

Figure 6:
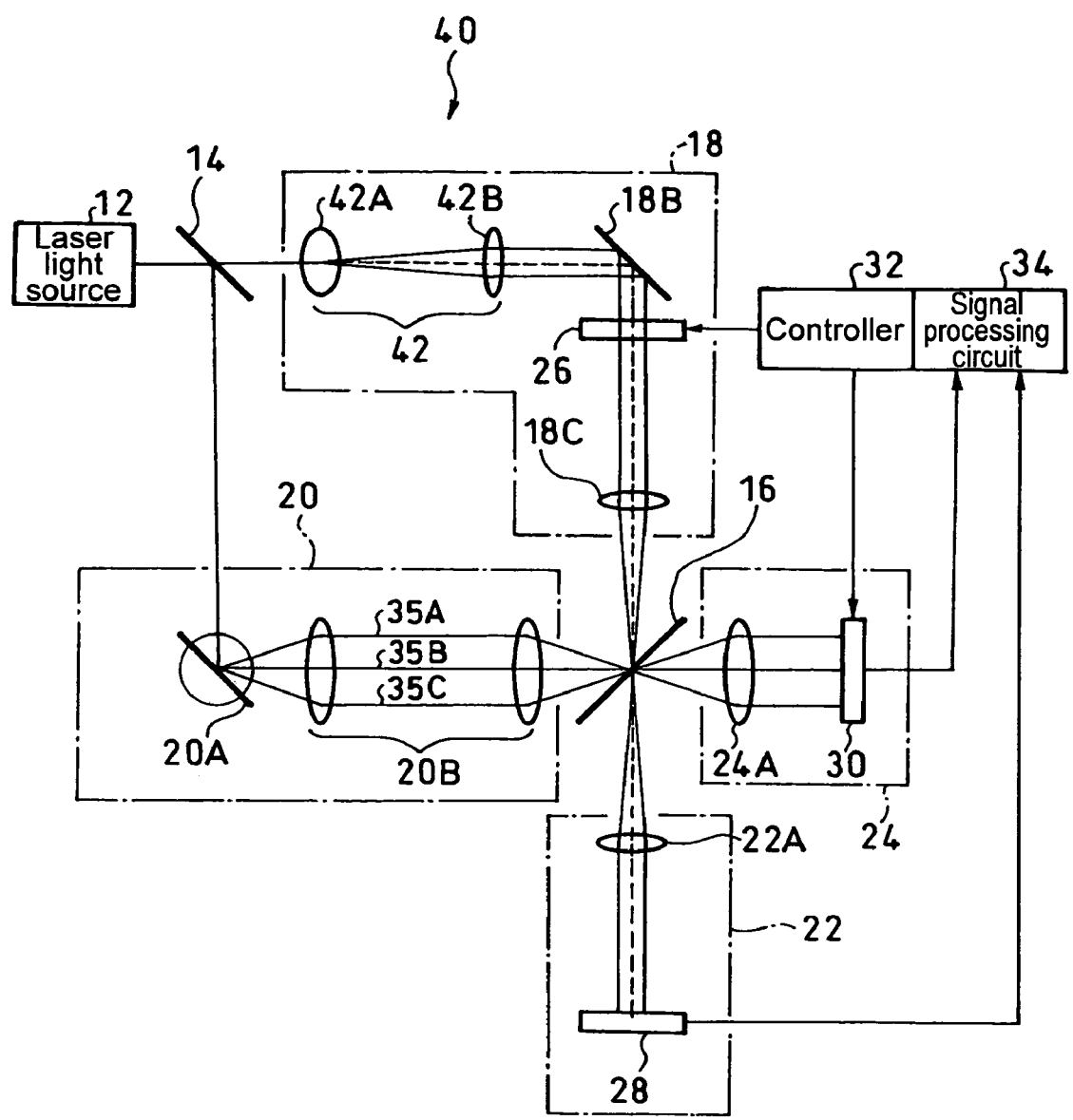
FIG. 6 is an optical system diagram illustrating a holographic recording and reproducing apparatus according to a fourth embodiment.

Accordingly, in FIG. 6, the same components as those of the holographic recording and reproducing apparatus 10 are indicated with the same reference numerals as those used for the components of FIG. 1, and will not be explained repeatedly.

The beam expander 42 according to the fourth embodiment is designed to slightly expand the beam diameter of a signal beam so that the signal beam passes only through the central data block DB22 in the spatial light modulator 26.

Here, of two lenses 42A and 42B constituting the beam expander 42, the focal length of the lens 42B closer to the mirror 18B is shorter than that of the lens closer to the mirror 18B in the beam expander 18A according to the first embodiment.

In the fourth embodiment, a retrieval signal beam reduced in beam diameter is still available for retrieval, and the retrieval signal beam thus increased in light power density allows for reducing exposure time per retrieval operation (which is determined by the photosensitivity of the retrieval imaging device 30) thereby improving retrieval speeds.

Fifth Embodiment

Now, referring to FIGS. 7 to 9, a fifth embodiment of the present invention will be described.

Figure 7:
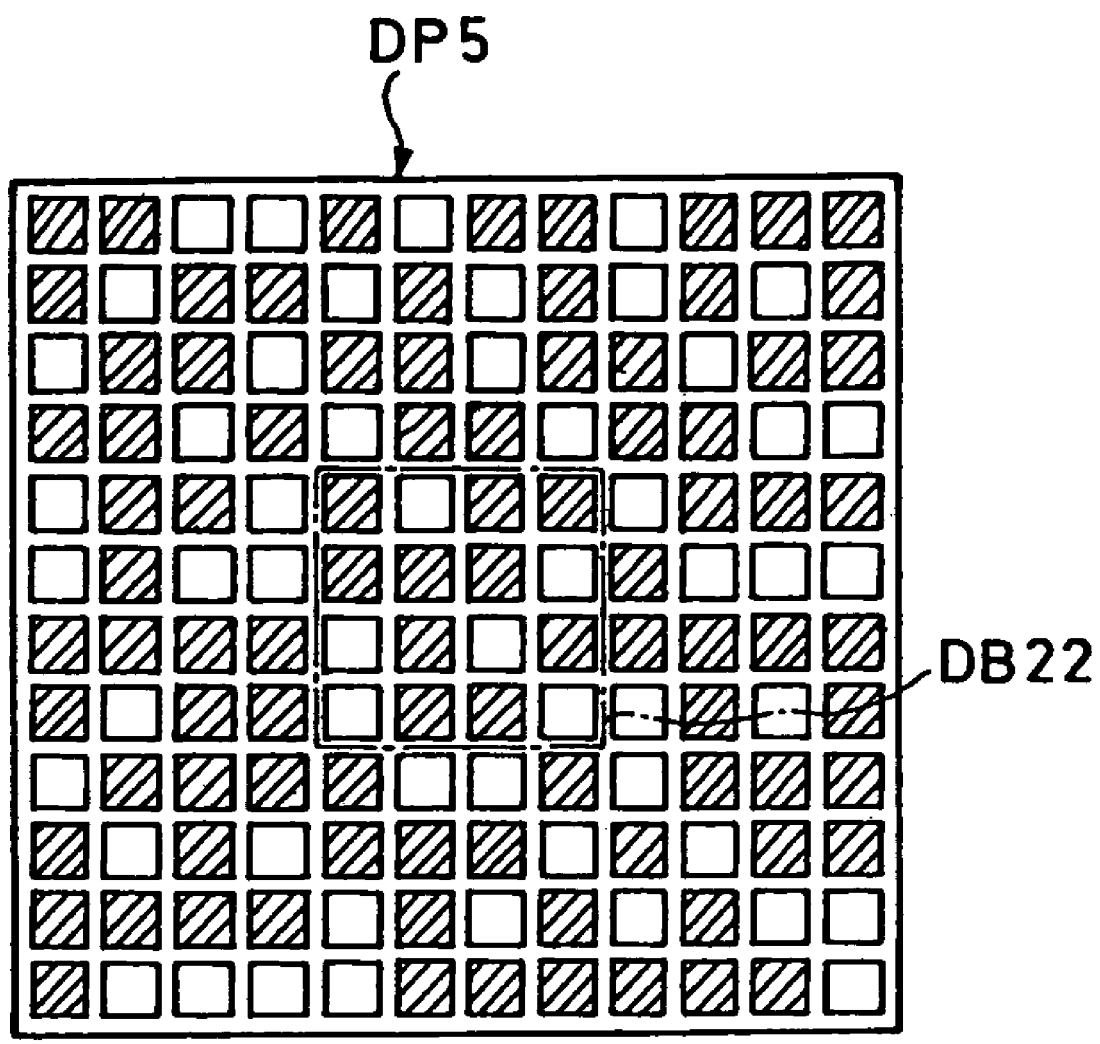
FIG. 7 is a schematic plan view illustrating a recorded data page according to a fifth embodiment.
Figure 8:
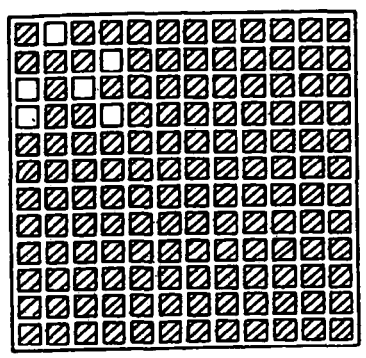
FIG. 8 is a schematic plan view illustrating a retrieval data block at the time of retrieval in the fifth embodiment.
Figure 8:
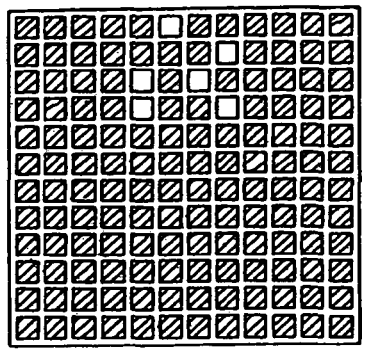
Figure 8:
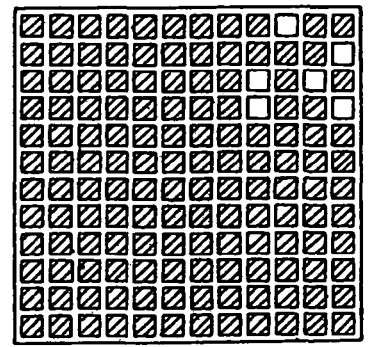
Figure 8:
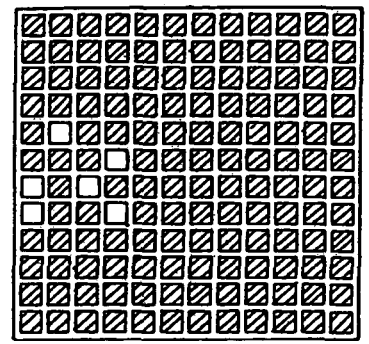
Figure 8:
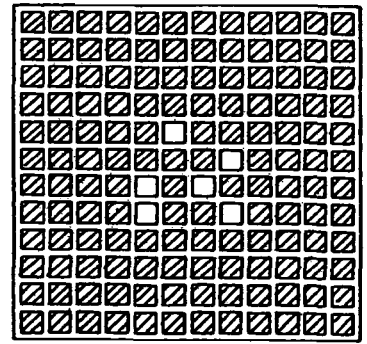
Figure 8:
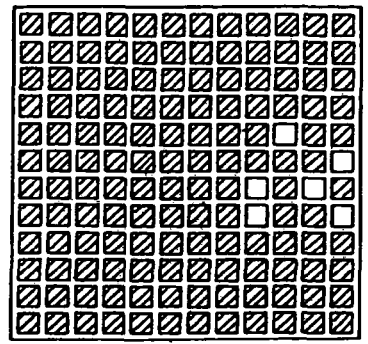
Figure 8:
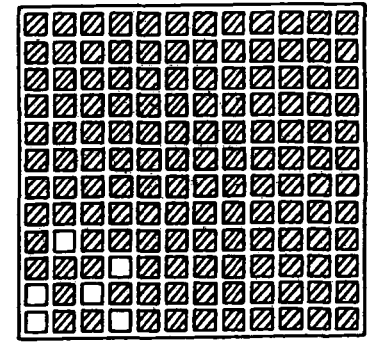
Figure 8:
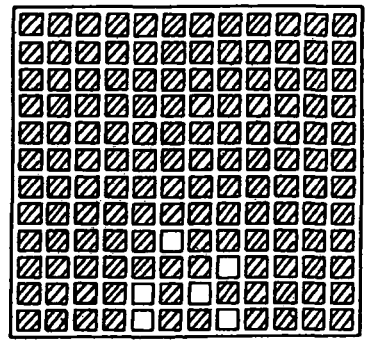
Figure 8:
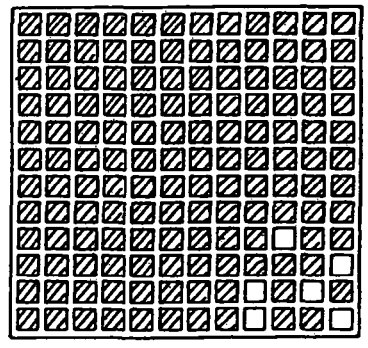

In the fifth embodiment, to retrieve the central data block DB22 in a data page DP5 shown in FIG. 7, the block information of the data block DB22 employed as a retrieval data block is sequentially displayed on the data blocks DB11 to DB33 as shown in FIGS. 8(A) to (I). That is, with the sequential retrieval data block DBS employed as the retrieval data block, the recording medium 16 is irradiated with a signal beam.

Figure 9:
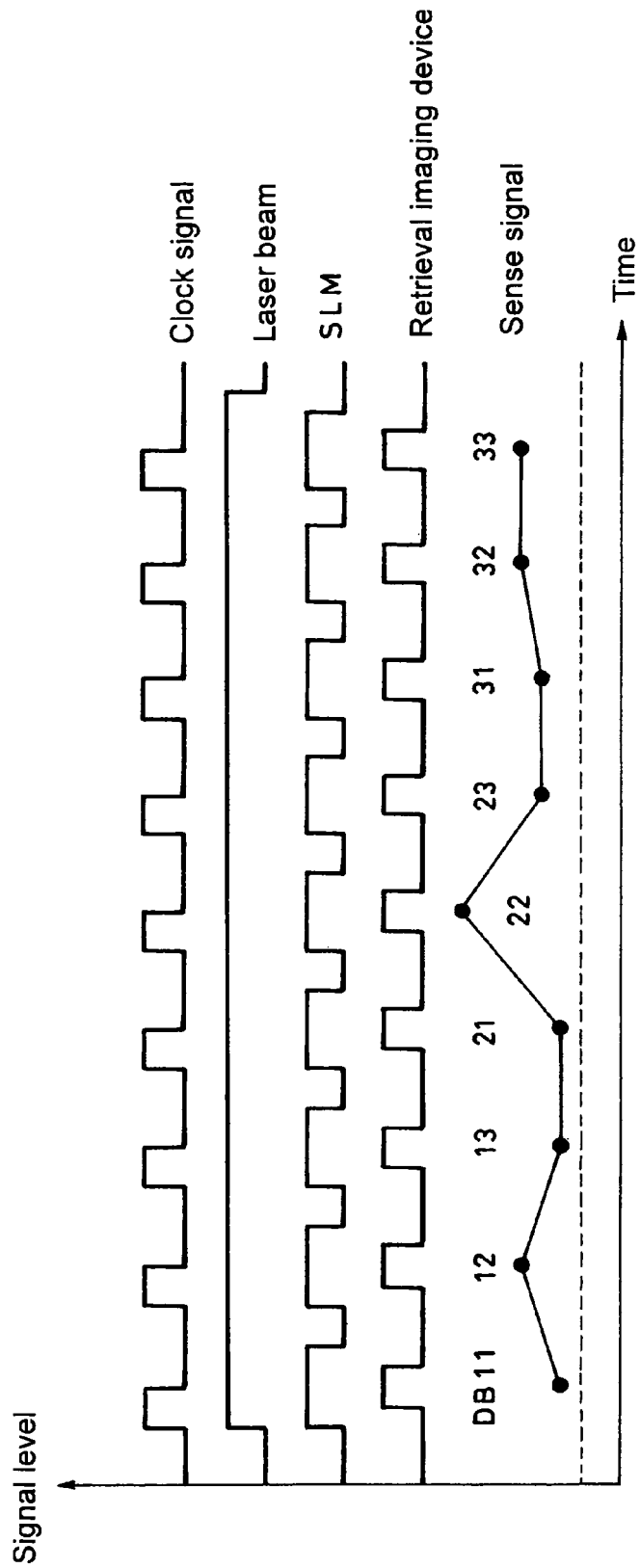
FIG. 9 is a diagram illustrating a clock signal delivered from a controller, a laser beam at the time of retrieval, the operating status of a spatial light modulator and a retrieval imaging device, and a sense signal in terms of the relation between the signal level and time in accordance with the fifth embodiment.

At this time, the timing of the emission of a laser beam, the timing of switching between frames in the spatial light modulator 26, and the timing of detecting the amount of light by the retrieval imaging device 30 are controlled by the controller 32 as shown in FIG. 9.

Note that the laser beam may be continuously emitted during a sequence of retrieval as shown in FIG. 9, or alternatively may be turned ON or OFF for each retrieval operation. However, when the detection window of the retrieval imaging device 30 is ON (in the state of the amount of light being detected), both the laser light source 12 and the spatial light modulator 16 are preferably ON.

The controller 32 generates a clock signal associated with each of the data blocks DB11 to DB33, and the laser light source 12 emits a laser beam immediately in response to the clock signal and a retrieval image is displayed on the spatial light modulator 26. Subsequently after a predetermined delay time, the detection window for detecting the amount of light in the retrieval imaging device 30 is opened.

As a result of the aforementioned retrieval operation, a sense signal as shown in FIG. 9 is provided for the pixel(s) associated with an intended data page in the retrieval imaging device 30. It is thus found that the maximum value of intensity of the signal exists in the data block DB22, and as a result, the retrieval information has been recorded in the data block DB22. The peak of the sense signal as shown in FIG. 9 will not appear in any data block at the other positions.

As described above, since the address of the information to be retrieved is definitely determined, the information can be reproduced by the reproduction imaging device 28 in accordance with a known reproduction method, i.e., by irradiating the intended data page DP with a reproduction reference beam.

Note that each of the aforementioned embodiments employs nine data blocks. In contrast to the number of data blocks or nine, a larger number N would allow for retrieval operations at higher speeds, where N is the number of multiplexed data pages DP. In practice, several hundred to several thousand data pages are often multiplexed for recording. In this case, it is possible to search for retrieval information in a significantly shorter period of time than for reproducing these data pages.

Sixth Embodiment

Now, referring to FIGS. 10(A) and (B), a sixth embodiment of the present invention will be described.

Figure 10:
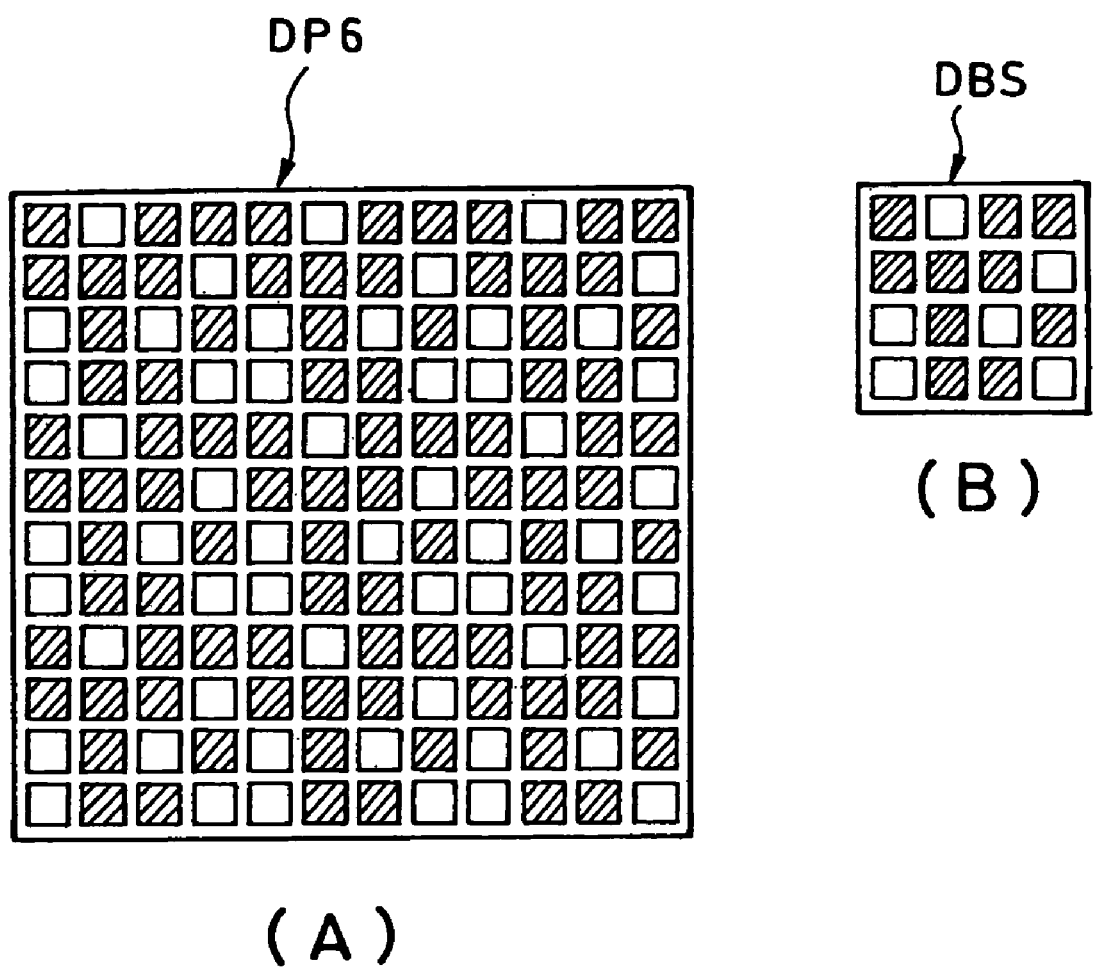
FIG. 10 is a schematic plan view illustrating a recorded data page and a retrieval data block in accordance with a sixth embodiment.

For example, suppose that the same data image being retrieved, which is shown in FIG. 10(B), is employed for retrieval. At the time of retrieval, the sixth embodiment is designed to display the data image at the same time on all the data blocks in the spatial light modulator 26. That is, the entirety of a data page DP6 displayed at the time of retrieval on the spatial light modulator 26 is employed as the retrieval data block DBS.

In the sixth embodiment, an image formed of the retrieval data blocks DBS, which are identical to each other as shown in FIG. 10(A), is displayed on the spatial light modulator 26, and the image is used to modulate a signal beam which in turn irradiates the recording medium 16. This causes only a hologram containing the retrieved image shown in FIG. 10(B) to constructively diffract the signal beam and transmit, as the diffracted beam, the reference beam used for recording. Detecting the diffracted beam by the retrieval imaging device 30 makes it possible to identify which data page DP contains the retrieval image.

Then, the recording medium 16 is irradiated with a reproduction reference beam associated with the detected data page DP from the reference optical system 20, thereby making it possible to reproduce the information of the retrieved data page DP out of the imaging optical system 22.

In this case, although it is not known in which data block within the data page the retrieval image is recorded, the page data that has been reproduced may be delivered to the signal processing circuit 34 and then decoded in order to extract only useful information.

A typical holographic memory has the amount of information of about several hundred kilo Bytes per one data page; for example, 1000 multiplexed data pages have the amount of information of about several hundred MB. According to the sixth embodiment, a one-second search operation confines the information to be searched for to one page (several hundred kilo Bytes) of 1000 data pages, thereby making it possible to significantly reduce the retrieval time even when the subsequent search is made after decoding.

To compare with the fifth embodiment, note that the fifth embodiment requires as many optical search operations as the number of data blocks in a data page but provides an advantage of being able to identify not only the data page that contains the retrieved information but also the data block.

In contrast to this, the sixth embodiment requires data to be processed after decoded, but may require only one optical search operation of a series of data pages that have been multiplexed for storage. A comparison of the speed of decoding or CPU processing with the operation of an optical system often shows that the former is generally higher in speed.

Accordingly, the fifth embodiment is more advantageous for a comparatively smaller number of data blocks in a data page, whereas the sixth embodiment is more advantageous for a larger number of data blocks.

Seventh Embodiment

Now, referring to FIGS. 11 and 12, a seventh embodiment of the present invention will be described.

Figure 11:
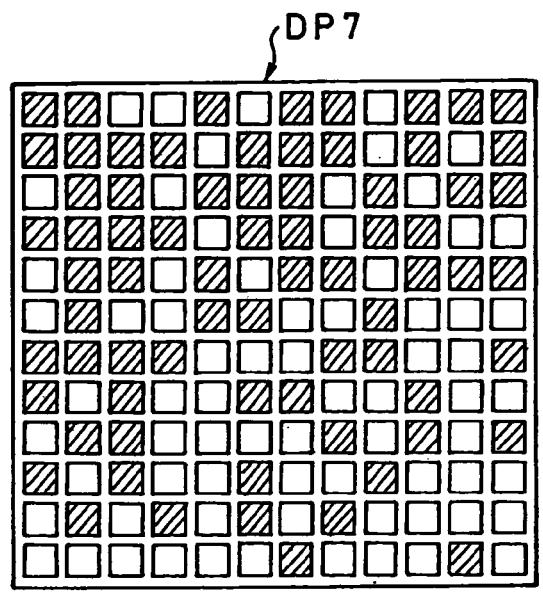
FIG. 11 is a schematic plan view illustrating a recorded data page in accordance with a seventh embodiment.
Figure 12:
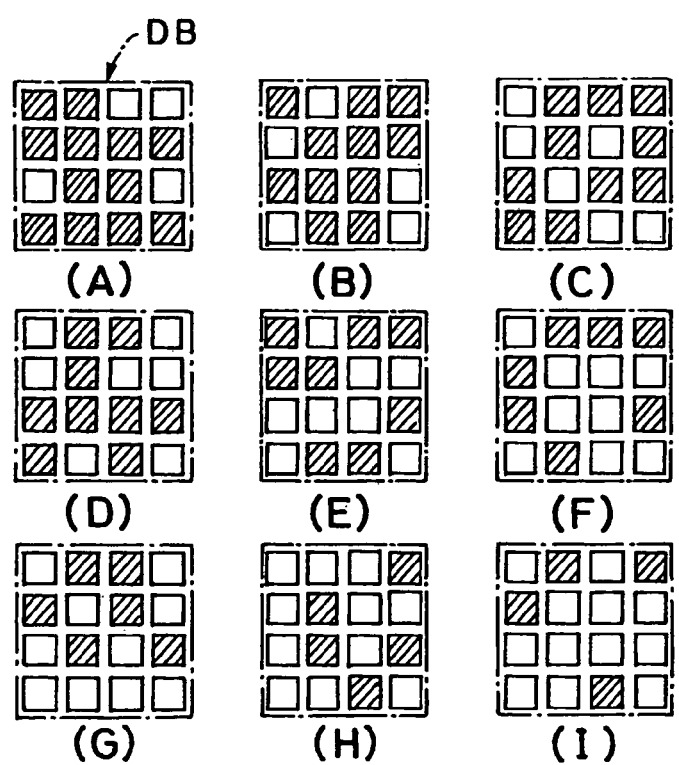
FIG. 12 is a schematic plan view illustrating the image of each data block in the data page.

According to the seventh embodiment, a data page DP7 recorded on the recording medium 16 is formed of nine data blocks DB as shown in FIG. 11, and as shown in FIGS. 12(A) to (I), each data block DB has a data image formed by an encoding method of providing a different number of ON pixels for each data block.

Accordingly, even the same information would be encoded into a different bit map image depending on the position of the data block on which the information is displayed.

As in the sixth embodiment, the same block information to be retrieved is displayed at the time of retrieval on all the data blocks in the spatial light modulator 26, allowing the signal beam to be modulated to irradiate the recording medium 16.

As described above, the same block information is displayed on each of the retrieval data blocks DBS, but is encoded differently thereby providing different bit map images. As in the sixth embodiment, performing an optical search operation under this condition allows the reference beam associated with the data page containing the retrieved information to be detected by the retrieval imaging device 30.

During this detection, since the number of ON pixels is different depending on the position of the data block as described above, the amount of light, i.e., the signal output to be detected by the retrieval imaging device 30 varies depending on "which data block the retrieved information belongs to". That is, one search operation allows for definitely determining not only on which data page the relevant information is found but also in which data block it is found.

Note that the seventh embodiment requires only one optical search operation of the same zone on the recording medium 16 (or the region having a series of multiplexed data pages) and eliminates the need of searching for decoding, thereby allowing for retrieval at higher speeds than in any of the fifth and sixth embodiments. However, a different amount of encoding at each data block will require an increase in the amount of computation needed in encoding and decoding of data.

Note that any data page is formed of 12×12=144 pixels in each of the aforementioned embodiments, however, this is shown only by way of example and the number of pixels is not limited to those of the embodiments.

INDUSTRIAL APPLICABILITY

The hologram retrieval method and holographic recording and reproducing apparatus of the present invention allow for input of retrieval data and detection of a diffracted beam on each data block that is obtained by dividing a data page into a plurality of equal parts. Accordingly, a small amount of data can be retrieved without a decrease in the amount of diffracted light. Furthermore, even a reduction in data size causes neither the retrieval accuracy to be decreased nor the retrieval itself to be made impossible. Thus, the method and apparatus are applicable to the field of high-speed mass storage.

The invention claimed is:

1. A method for searching holograms to determine the address of a target data page recorded in a holographic recording medium, the method comprising the steps of:

emitting a signal beam;

modulating the signal beam, by a spatial light modulator, using a search data page having a plurality of equally divided data blocks, at least one of the data blocks of the search data page consisting of an encoded search image;

irradiating the modulated signal beam onto the holographic recording medium having digital information encoded in a plurality of data pages multiplexedly recorded thereon, each data page having a plurality of equally divided data blocks, to transmit one or more diffracted beams;

receiving the one or more diffracted beams emitted from the holographic recording medium in response to the modulated signal beam;

detecting a target diffracted beam having a maximum intensity of the one or more diffracted beams; and determining an address of the target diffracted beam as the address of a target data page that comprises an encoded target data image matching the encoded search image, wherein the recorded data pages have data blocks comprising data images encoded by an encoding method that provides a same number of ON pixels.

2. The method according to claim 1, wherein all pixels in the data blocks of the search data page other than the at least one search data block are OFF pixels.

3. The method according to claim 2, wherein one data block in each data page in the holographic recording medium is a dedicated search data block having a larger number of ON pixels than the other data blocks of the data page.

4. The method according to claim 2, wherein the encoded search image is sequentially displayed on the at least one of the data blocks in the search data page of the spatial light modulator.

5. The method according to claim 1, wherein one data block of each data page in the holographic recording medium is a dedicated search data block having a larger number of ON pixels than the other data blocks of the data page.

6. The method according to claim 1, further comprising:

adjusting a beam diameter and an optical path of the signal beam such that the signal beam passes substantially only through the at least one search data block displayed on the spatial light modulator.

7. The method according to claim 1, wherein the encoded search image to be retrieved is sequentially displayed on the at least one of the data blocks of the search data page in the spatial light modulator.

8. The method according to claim 1, wherein the encoded search image is displayed at the same time in all of the data blocks in the search data page used by the spatial light modulator.

9. The method according to claim 8, further comprising:

generating a reproduction reference beam having the determined address to retrieve the target data page; and irradiating the holographic recording medium by the reproduction reference beam to reproduce the target data page.

10. The method according to claim 1, further comprising:

generating a reproduction reference beam having the determined address to retrieve the target data page; and irradiating the holographic recording medium by the reproduction reference beam to reproduce the target data page.

11. A method for searching holograms to determine the address of a target data page recorded in a holographic recording medium, the method comprising the steps of:
generating a signal beam;
modulating the signal beam by a spatial light modulator using a search data page having a plurality of equally sized data blocks, a same search image being encoded into each data block of the search data page;
irradiating the modulated signal beam onto the holographic recording medium having digital information encoded in a plurality of data pages multiplexedly recorded thereon to transmit one or more diffracted beams, each recorded data page comprising a plurality of equally divided data blocks;
receiving the one or more diffracted beams emitted from the holographic recording medium;
detecting a target diffracted beam having a maximum intensity of the one or more diffracted beams; and
determining an address of the target diffracted beam as an address of a target data page,
wherein each data block of the recorded data pages recorded in the holographic recording medium contains a data image formed by an encoding method that provides a different number of ON pixels for each data block.

12. The method according to claim 11, further comprising:
generating a reproduction reference beam having the determined address to retrieve the target data page; and
irradiating the holographic recording medium by the reproduction reference beam to reproduce the target data page.

13. A holographic recording and reproducing apparatus comprising:
an object optical system that directs an object beam to a holographic recording medium having holograms recorded thereon, the holograms comprising a plurality of multiplexedly recorded data pages each storing encoded digital information, each data page being separately retrievable;
a reference optical system that directs a reference beam to the holographic recording medium;
a spatial light modulator provided in the object optical system that displays a search data page including a plurality of data blocks, the data blocks of the search data page being equally sized with each other, the spatial light modulator encoding search information into at least one data block of the search data page, the object optical system modulating the object beam by the search data page having the encoded search information;
a search imaging device for receiving a plurality of diffracted beams produced by the holographic recording medium when the holographic recording medium is irradiated with the modulated object beam output from the object optical system;
a signal processing circuit for processing an output signal from the search imaging device, and that identifies an address of a target data page containing the encoded search information as an address corresponding to a diffracted beam having a maximum intensity of the plurality of diffracted beams; and
a reproduction imaging device for receiving a diffracted beam produced by the holographic recording medium in response to irradiation with a reproduction reference beam having the determined address from the reference optical system and for reproducing the digital information of the target data page retrieved by the diffracted beam.

14. The holographic recording and reproducing apparatus according to claim 13,
wherein the spatial light modulator is configured such that all pixels in the data blocks of the search data page other than the at least one data block of the search data page in which the search information is displayed are OFF pixels.

15. The holographic recording and reproducing apparatus according to claim 14,
wherein the spatial light modulator employs one of the data blocks in each search data page as a dedicated search data block, and,
for each search data page, the dedicated search data block comprises a data image having a larger number of ON pixels than any data images in the other data blocks of the data page.

16. The holographic recording and reproducing apparatus according to claim 13,
wherein the spatial light modulator employs one of the data blocks in each search data page as a dedicated search data block, and,
for each search data page, the dedicated search data block comprises a data image having a larger number of ON pixels than any data images in the other data blocks of the data page.

17. The holographic recording and reproducing apparatus according to claim 13,
wherein the object optical system is configured such that a beam diameter and an optical path of the object beam can be adjusted so that the object beam passes substantially only through the at least one search data block displayed on the spatial modulator.

18. The holographic recording and reproducing apparatus according to claim 13,
wherein the spatial light modulator is configured such that the search information can be sequentially displayed on the plurality of data blocks of the search data page.

19. The holographic recording and reproducing apparatus according to claim 13, wherein:
the spatial light modulator is configured such that the search information can be displayed at the same time in all of the data blocks in the search data page of the spatial light modulator.

20. A holographic recording and reproducing apparatus comprising:
an object optical system that directs an object beam to a holographic recording medium having holograms recorded thereon, the holograms comprising a plurality of multiplexedly recorded data pages each storing encoded digital information, each data page being separately retrievable;
a reference optical system that directs a reference beam to the holographic recording medium;
a spatial light modulator provided in the object optical system that displays to-be-recorded digital information as a to-be-recorded data image in at least one of a plurality of data blocks of a search data page, the data blocks being equally sized with each other, wherein the object optical system modulates the object beam by the to-be-recorded digital information;
a search imaging device for receiving a plurality of diffracted beams produced by the holographic recording medium when the holographic recording medium is irradiated with the modulated object beam output from the object optical system;
a signal processing circuit for processing an output signal from the search imaging device, and for identifying an address of a target data block and a target data page corresponding to the diffracted beam having a maximum intensity of the plurality of diffracted beams; and a reproduction imaging device for receiving a diffracted beam produced at the time of irradiation with a reproduction reference beam having the identified address from the reference optical system and for reproducing the digital information of the target data page retrieved by the diffracted beam, wherein the spatial light modulator encodes the to-be-recorded data image by an encoding method to generate the to-be-recorded digital information, the encoding method provides a different number of ON pixels for each data block of a search data page.

* * * * *